US008936425B2

(12) United States Patent
Lee

(10) Patent No.: US 8,936,425 B2
(45) Date of Patent: Jan. 20, 2015

(54) ANCILLARY APPARATUS AND METHOD FOR LOADING GLASS SUBSTRATES INTO A BRACKET

(75) Inventor: Yi-Lung Lee, Taichung (TW)

(73) Assignee: Tera Autotech Corporation, Taichung (TW)

( * ) Notice: Subject to any disclaimer, the term of this patent is extended or adjusted under 35 U.S.C. 154(b) by 438 days.

(21) Appl. No.: 13/356,037

(22) Filed: Jan. 23, 2012

(65) Prior Publication Data

US 2013/0189068 A1 Jul. 25, 2013

(51) Int. Cl.
*H01L 21/67* (2006.01)
*B65G 49/06* (2006.01)
*C03B 35/20* (2006.01)
*H01L 21/677* (2006.01)

(52) U.S. Cl.
CPC ......... *C03B 35/205* (2013.01); *H01L 21/67781* (2013.01); *Y10S 414/138* (2013.01)
USPC ...................................... 414/416.11; 414/938

(58) Field of Classification Search
CPC ...... B65G 1/023; B65G 1/026; B65G 1/0464; B65G 1/06; B65G 1/10; B65G 1/12; B65G 1/127; B65G 49/06; B65G 49/061; B65G 49/067; C03B 35/00; C03B 35/14; C03B 35/145; C03B 35/205; H01L 21/67778; H01L 21/67781; Y10S 414/138
USPC ........... 211/1.57, 41.14; 269/289 MR, 55, 58, 269/60, 61, 87.1; 414/266, 267, 268, 269, 414/277, 281, 282, 283, 284, 627, 630, 662, 414/737, 785, 808, 814, 815, 416.11, 938
See application file for complete search history.

(56) References Cited

U.S. PATENT DOCUMENTS

| 4,306,731 | A | * | 12/1981 | Shaw ........................... 279/4.04 |
| 4,311,427 | A | * | 1/1982 | Coad et al. .................... 414/217 |
| 4,449,885 | A | * | 5/1984 | Hertel et al. ............. 414/416.08 |
| 4,534,314 | A | * | 8/1985 | Ackley ........................... 118/733 |
| 4,588,342 | A | * | 5/1986 | Hirokawa et al. .......... 414/797.4 |
| 4,611,966 | A | * | 9/1986 | Johnson ........................ 414/404 |
| 4,647,266 | A | * | 3/1987 | Coad et al. ............... 414/226.01 |
| 4,699,554 | A | * | 10/1987 | Kawashima et al. ......... 414/217 |
| 4,778,382 | A | * | 10/1988 | Sakashita ...................... 432/239 |
| 4,806,057 | A | * | 2/1989 | Cay et al. ................. 414/226.01 |
| 4,936,328 | A | * | 6/1990 | Yatabe ............................. 134/66 |
| 5,007,788 | A | * | 4/1991 | Asano et al. ............. 414/416.09 |
| 5,054,988 | A | * | 10/1991 | Shiraiwa ....................... 414/404 |
| 5,125,784 | A | * | 6/1992 | Asano ........................... 414/404 |
| 5,131,799 | A | * | 7/1992 | Nishi et al. ............... 414/416.09 |

(Continued)

*Primary Examiner* — Saul Rodriguez
*Assistant Examiner* — Brendan Tighe
(74) *Attorney, Agent, or Firm* — Muncy, Geissler, Olds & Lowe, P.C.

(57) ABSTRACT

An ancillary apparatus for loading glass substrates into a bracket through a robotic arm includes a holding rack to hold a bracket, a guiding mechanism located above the bracket and a glass lifting mechanism located below the bracket. The robotic arm grips the glass substrate and moves the glass substrate above the bracket to be guided by the guiding mechanism and held by the glass lifting mechanism, and then the glass substrate is released from the robotic arm. The glass substrate is guided by the guiding mechanism and braced by the glass lifting mechanism, and then is lowered slowly into the bracket. Hence the robotic arm does not need to be entered the bracket to load the glass substrate, extra space to receive the robotic arm can be saved and thus more glass substrates can be loaded. The cost is reduced and productivity is improved to meet production requirements.

18 Claims, 10 Drawing Sheets

(56) References Cited

U.S. PATENT DOCUMENTS

| | | | |
|---|---|---|---|
| 5,155,888 A * | 10/1992 | Lau | 29/25.01 |
| 5,383,783 A * | 1/1995 | Ishimori | 432/253 |
| 5,501,568 A * | 3/1996 | Ono | 414/416.02 |
| 5,730,051 A * | 3/1998 | Takahashi et al. | 101/126 |
| 5,906,158 A * | 5/1999 | Takai | 101/123 |
| 8,788,086 B2 * | 7/2014 | Franz | 700/218 |
| 2011/0041716 A1* | 2/2011 | Willshere et al. | 101/407.1 |

* cited by examiner

ANCILLARY APPARATUS AND METHOD FOR LOADING GLASS SUBSTRATES INTO A BRACKET

FIELD OF THE INVENTION

The present invention relates to a solar power fabrication apparatus and particularly to an ancillary apparatus to load glass substrates into a bracket.

BACKGROUND OF THE INVENTION

Solar power generation is a renewable energy source of great potential. It can significantly reduce carbon emission and gets increasing attention. However, due to physical limitation, the efficiency of solar power generation is still not desirable to date, and the cost of solar power generation remains very high. How to reduce the cost of solar power generation is a main focus in solar power development at present.

A solar panel mainly is a multi-layer polycrystalline silicon film formed on a glass substrate via various semiconductor manufacturing processes. It can absorb light to generate electricity. The glass substrate is smooth and brittle and easily broken. Hence when the glass substrate is gripped by a robotic arm and loaded into a bracket the robotic arm has to be extended deeply into the bracket before releasing to avoid the glass substrate from dropping and hitting the bracket and damaged.

In order to enable the robotic arm to be extended into the bracket, the bracket has to provide sufficient space to accommodate the robotic arm. As a result, the amount of glass substrate the bracket can hold decreases. Moreover, extending the robotic arm into the bracket also increases fabrication time and results in lower productivity and higher production cost. There is still room for improvement.

SUMMARY OF THE INVENTION

Therefore, the primary object of the present invention is to provide an ancillary apparatus and method for loading glass substrates into a bracket without a robotic arm entering into the bracket to fully utilize the space in the bracket.

To achieve the foregoing object, the ancillary apparatus according to the invention allows a robotic arm to load a glass substrate onto a bracket. It includes a holding rack, a guiding mechanism and a glass lifting mechanism. The holding rack aims to hold the bracket. The guiding mechanism is located above the bracket and has two guiding portions corresponding to two sides of the bracket to receive the glass substrate gripped by the robotic arm, and guide the glass substrate into the bracket. The glass lifting mechanism is located below the bracket and includes a brace rack running through the bracket to brace the glass substrate. The brace rack can be moved upwards and downwards, and forwards and backwards.

The method according to the invention comprises steps as follows: positioning the bracket on the holding rack; gripping the glass substrate by the robotic arm and moving the glass substrate above the bracket to allow the glass substrate to be received by the guiding mechanism and glass lifting mechanism; releasing the glass substrate from the robotic arm, and guiding the glass substrate via the guiding mechanism and holding the glass substrate by the glass lifting mechanism to enter the bracket.

Thus, through the guiding mechanism and glass lifting mechanism of the invention, the glass substrate can be loaded into the bracket without the robotic arm entering the bracket.

Therefore, no space is needed to be spared in the bracket to receive the robotic arm and the interior space of the bracket can be fully utilized to load more glass substrates. As a result, the cost is lower and productivity increases to better meet production requirements.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENT

Figure 1:
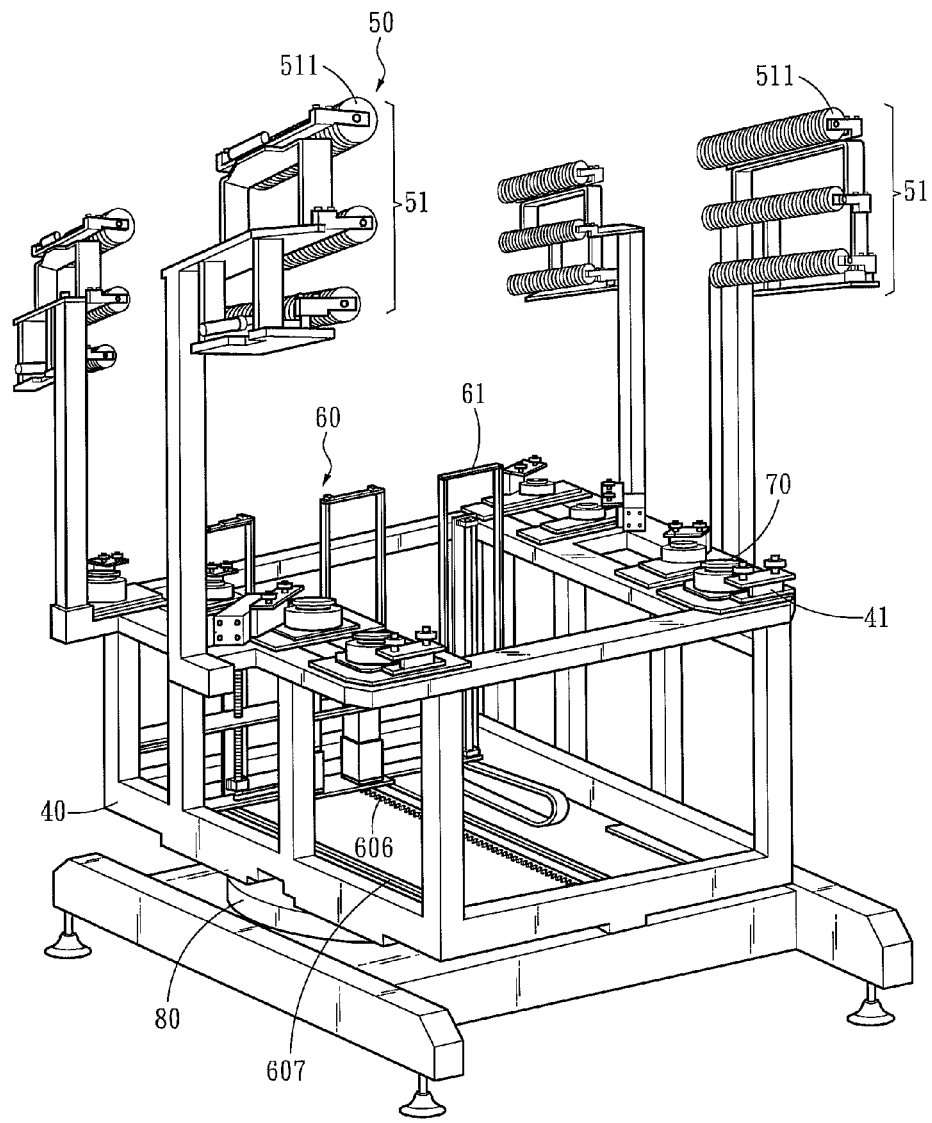
FIG. 1 is a perspective view of the invention.
Figure 2:
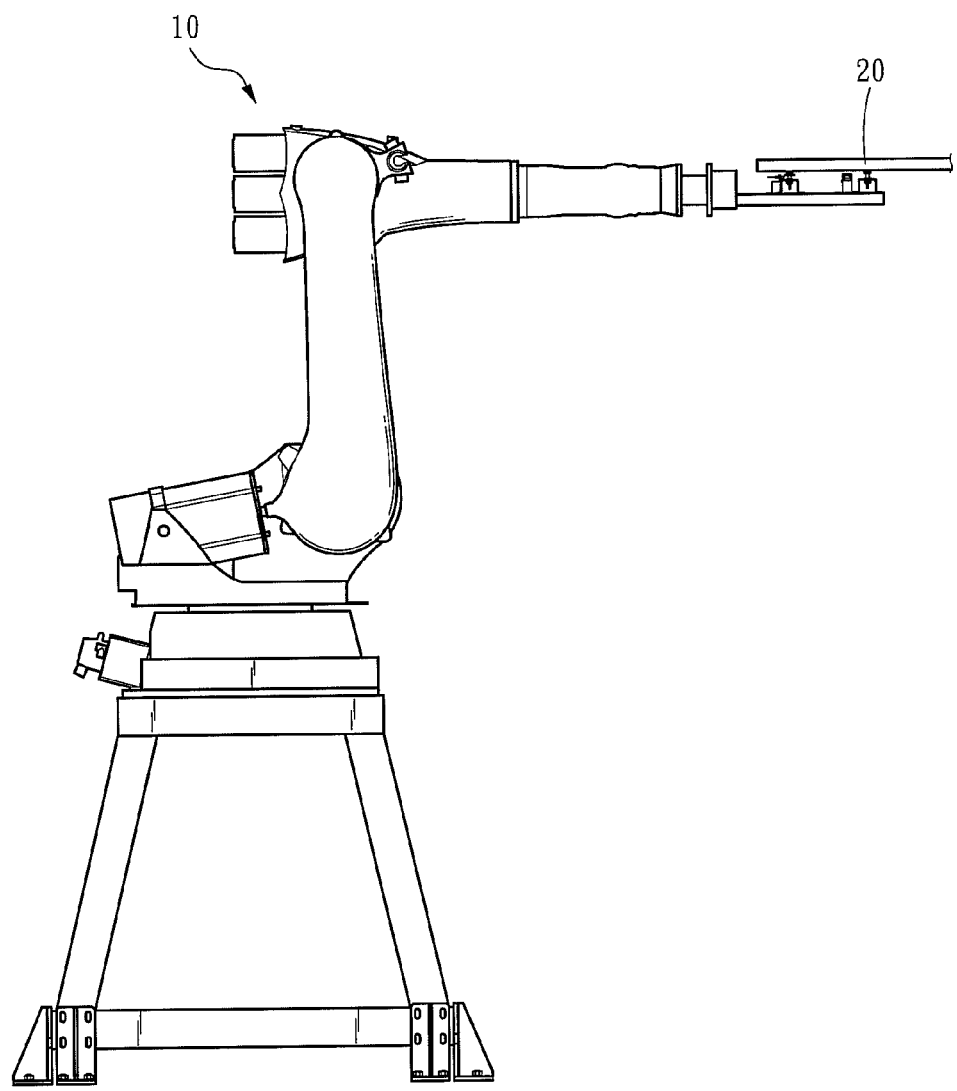
FIG. 2 is a schematic view of the robotic arm used in the invention.
Figure 3:
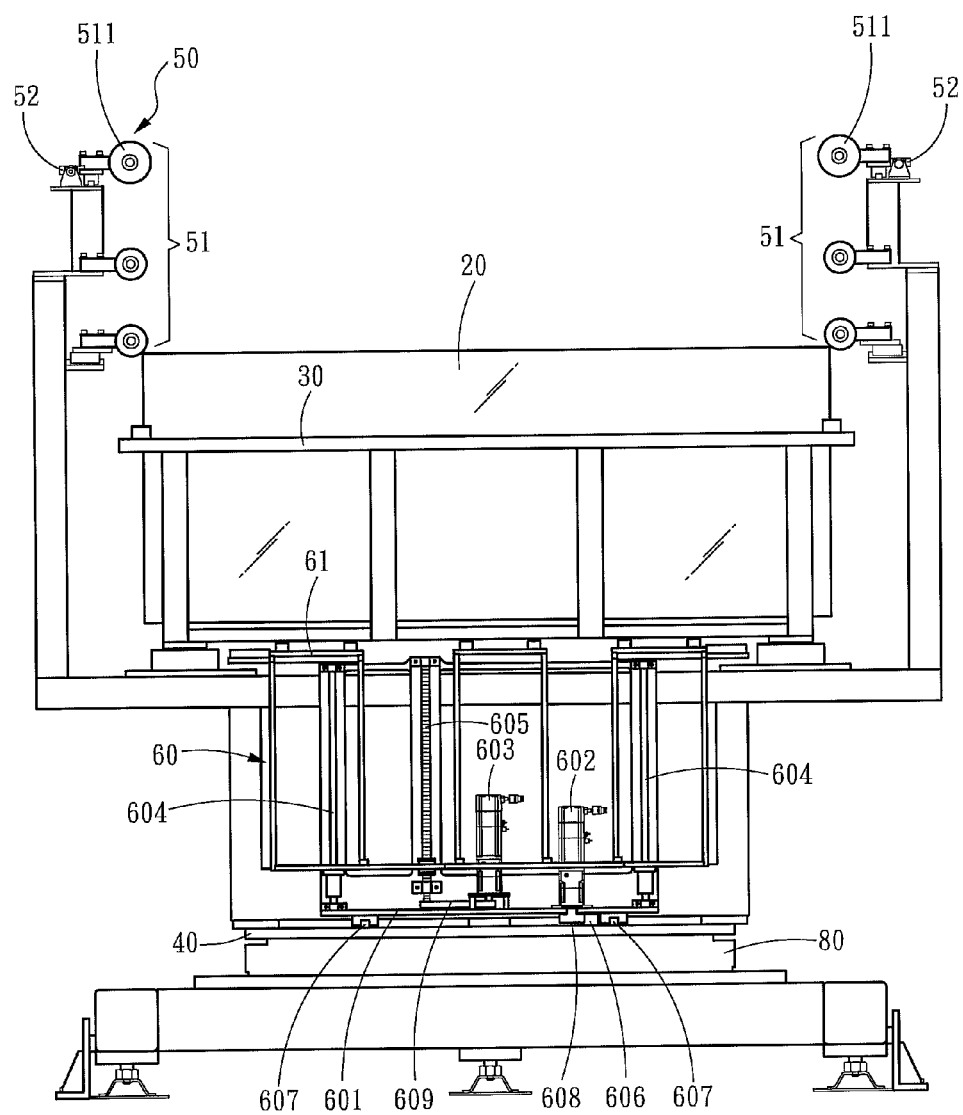
FIG. 3 is a front view for holding and positioning the bracket according to the invention.
Figure 4:
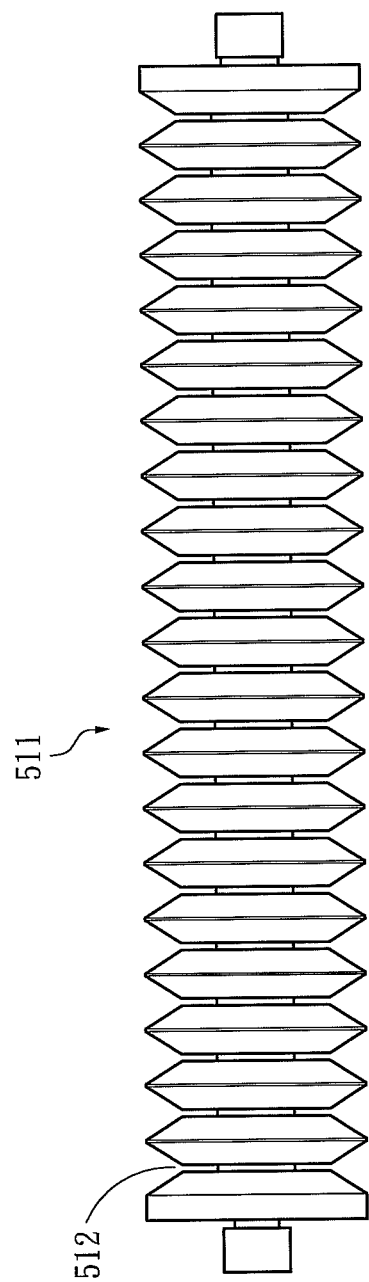
FIG. 4 is a schematic view of the ancillary roller of the invention.

Please refer to FIGS. 1, 2 and 3, the present invention aims to provide an ancillary apparatus to load glass substrates 20 into a bracket 30 through a robotic arm 10. It includes a holding rack 40, a guiding mechanism 50 and a glass lifting mechanism 60. The holding rack 40 holds and anchors the bracket 30. The guiding mechanism 50 is located above the bracket 30 and has two guiding portions 51 corresponding to two sides of the bracket 30 to receive the glass substrate 20 gripped by the robotic arm 10, and guide the glass substrate 20 into the bracket 30. Each guiding portion 51 has at least one ancillary roller 511. Also referring to FIG. 4, the ancillary roller 511 has a plurality of notches 512 corresponding to the glass substrate 20. The ancillary roller 511 is located on a transverse moving member 52 which drives the ancillary roller 511 transversely to facilitate entering of the glass substrate 20.

Figure 5:
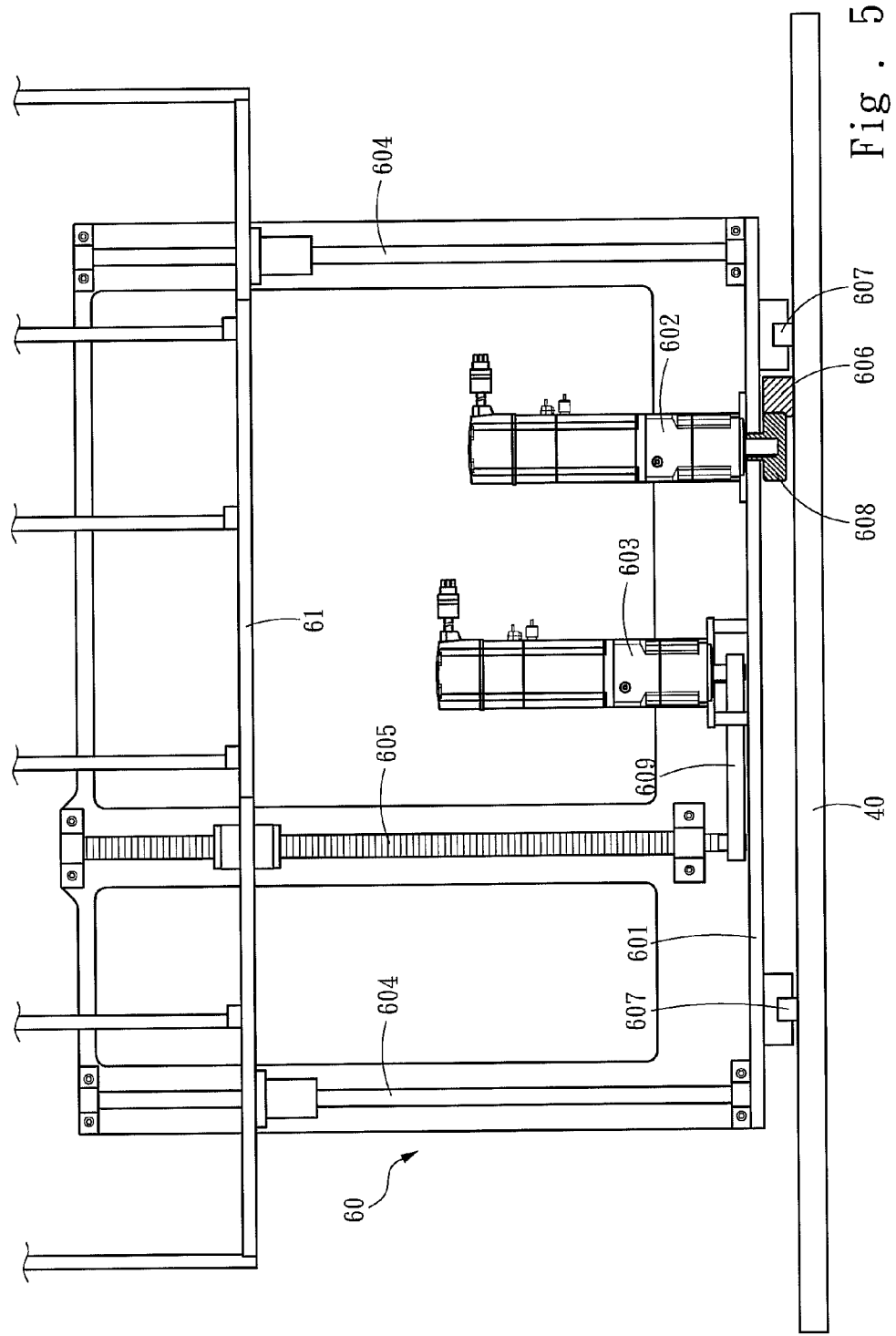
FIG. 5 is a front view of the glass lifting mechanism of the invention.

Also referring to FIG. 5, the glass lifting mechanism 60 is located below the bracket 30 and includes a brace rack 61 running through the bracket 30 to brace the glass substrate 20. The brace rack 61 can be moved upwards and downwards, and forwards and backwards.

The glass lifting mechanism 60 further includes a moving deck 601, a moving motor 602, a lifting motor 603, at least one upright post 604, a screw bar 605 and a straight gear rack 606. The moving deck 601 is slidably located on the holding rack 40. In an embodiment of the invention, the holding rack 40 has at least one guide rod 607 parallel with the straight gear rack 606. The moving deck 601 straddles the guide rod 607. The moving motor 602 and lifting motor 603 are fixedly located on the moving deck 601. The moving motor 602 engages with the straight gear rack 606 via a gear 608. The straight gear rack 606 is fixedly located on the holding rack 40. The upright post 604 and screw bar 605 are mounted upright onto the moving deck 601. The upright post 604 runs through the brace rack 61. The screw bar 605 screws through the brace rack 61. The lifting motor 603 engages with the screw bar 605 via a belt 609. Thereby, the moving motor 602 and lifting motor 603 drive respectively the gear 608 and belt 609 to move the brace rack 61 upwards and downwards, and forwards and backwards.

Figure 6:
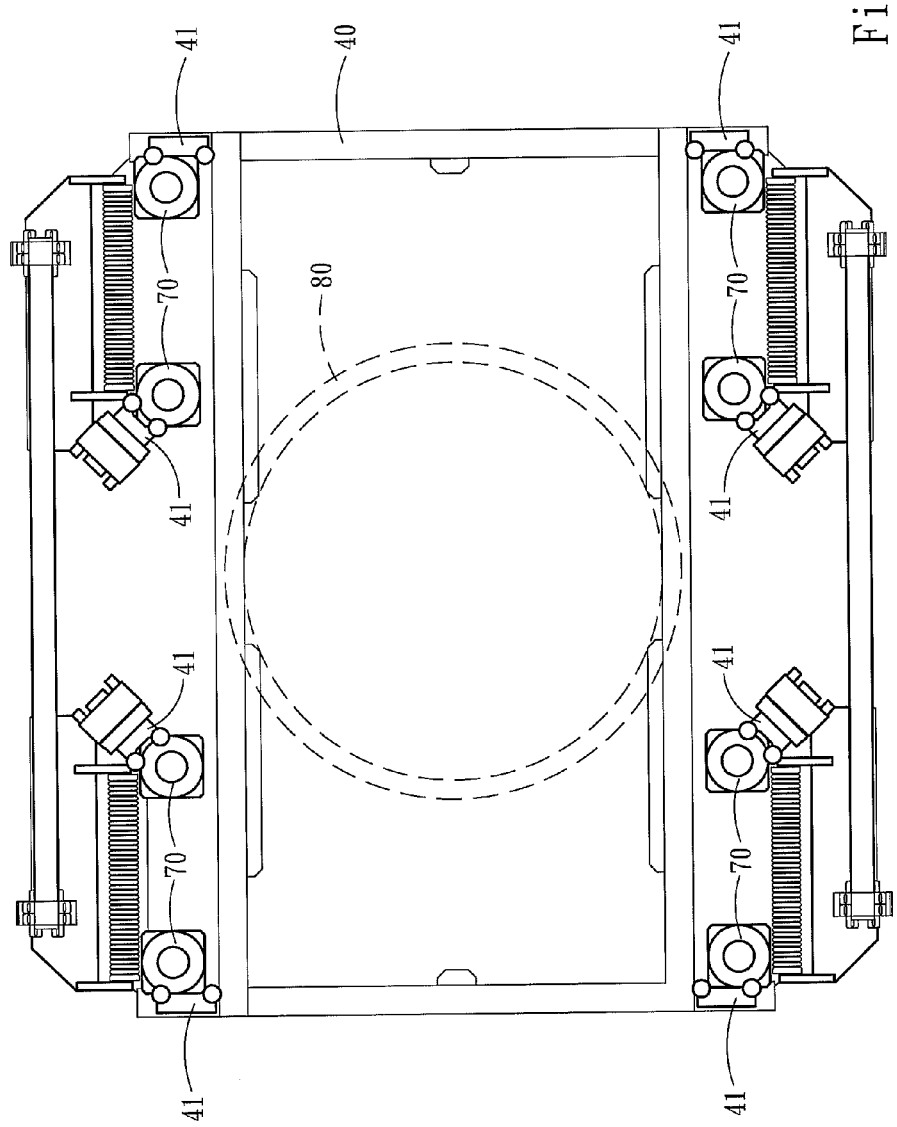
FIG. 6 is a top view of the holding rack of the invention.
Figure 7:
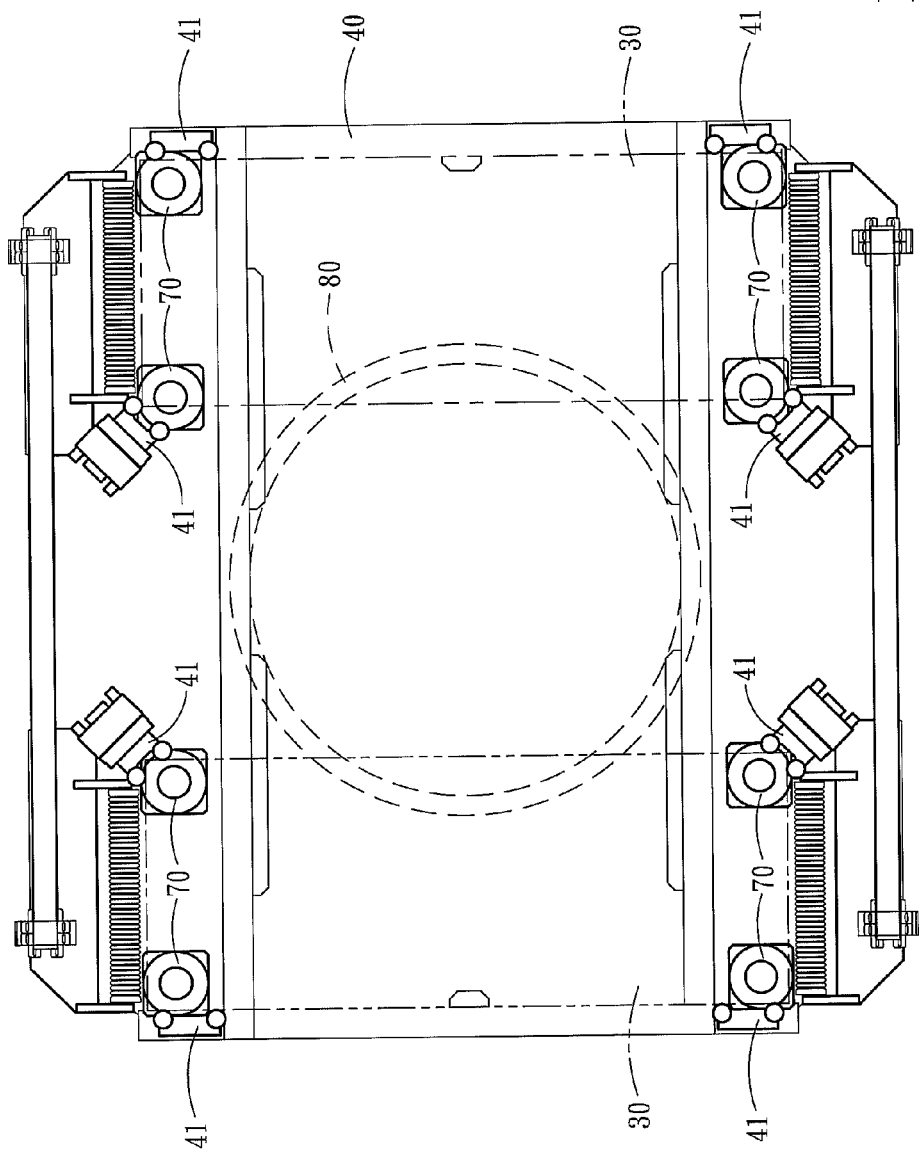
FIG. 7 is a schematic view of installing the bracket on the holding rack of the invention.

Referring to FIGS. 6 and 7, the holding rack 40 can hold two brackets 30 at the same time. The holding rack 40 is mounted onto a rotary station 80 which can be swiveled as desired to change the bracket 30 to be used. The bracket 30 is formed in a rectangular shape with four corners. The holding rack 40 has four positioning elements 41 corresponding to the bracket 30. The four positioning elements 41 butt the four corners to confine and hold the bracket 30. The invention further includes four movement adjustment decks 70 adjacent to the four positioning elements 41 to hold the bracket 30.

Figure 8A:
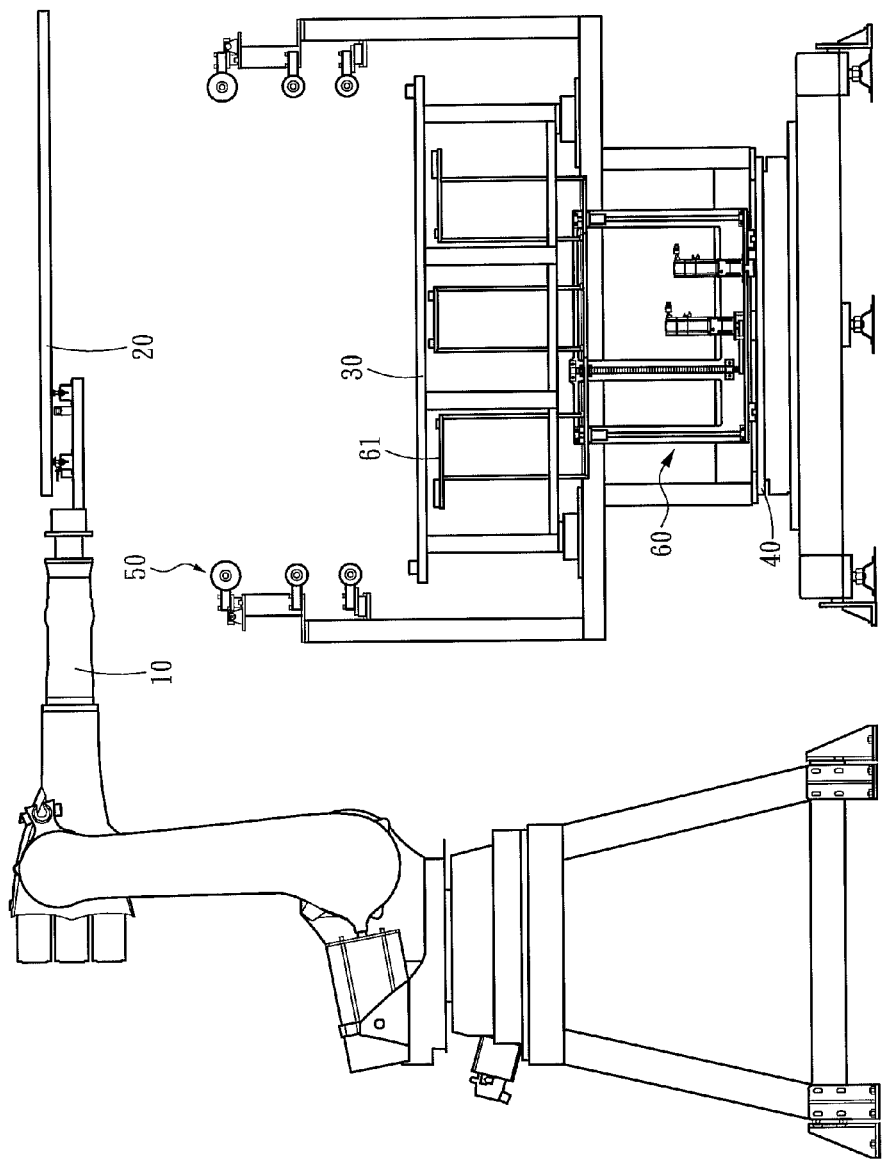
FIGS. 8A through 8C are schematic views of the invention in use conditions.
Figure 8B:
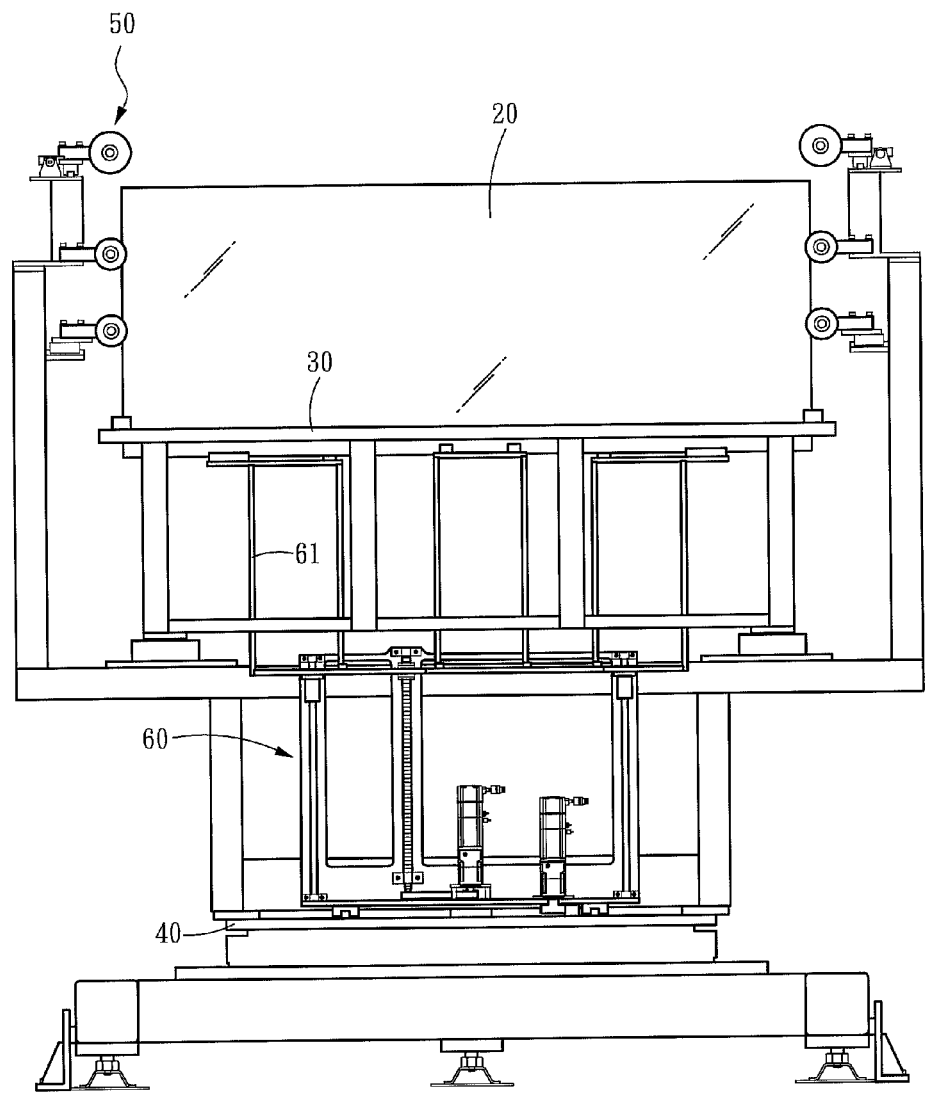
Figure 8C:
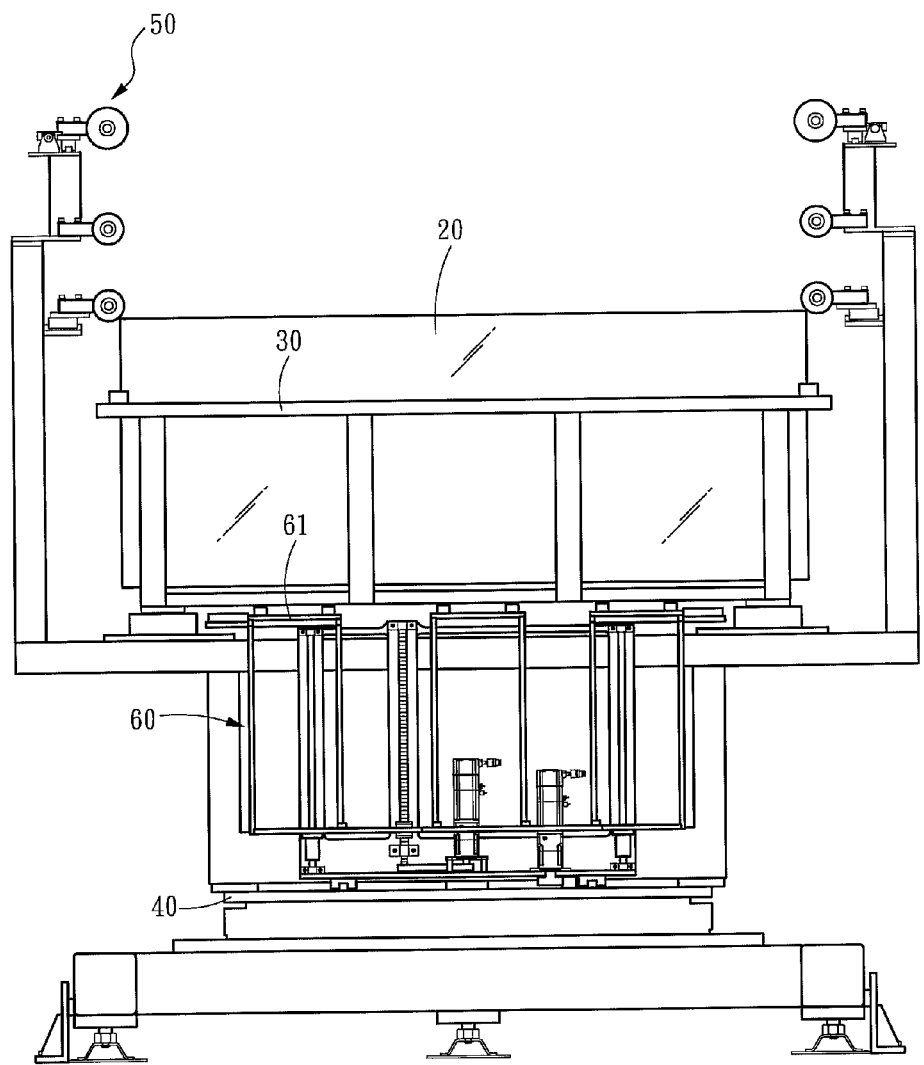

Referring to FIGS. 8A through 8C, through the structure previously discussed, the method of the invention includes the steps as follows:

first, positioning the bracket 30 securely onto the holding rack 40, positioning the guiding mechanism 50 above the bracket 30 and positioning the glass lifting mechanism 60 below the bracket 30;

next, gripping the glass substrate 20 via the robotic arm 10 and moving the glass substrate 20 above the bracket 30 (as shown in FIG. 8A) to allow the glass substrate 20 to be received by the guiding mechanism 50 and glass lifting mechanism 60 (as shown in FIG. 8B); the guiding mechanism 50 can confine the sliding direction of the glass substrate 20; the glass lifting mechanism 60 has the brace rack 61 to brace the glass substrate 20; initially, the brace rack 61 is located at the upmost position to hold the glass substrate 20, while the guiding mechanism 50 grips two ends of the glass substrate 20; and finally, releasing the glass substrate 20 from the robotic arm 10 and guiding the glass substrate 20 by the guiding mechanism 50 and holding the glass substrate 20 by the glass lifting mechanism 60 to move the glass substrate 20 gradually downwards into the bracket 30 to be positioned (as shown in FIG. 8C). After the glass substrate 20 has entered the bracket 30, the brace rack 61 can be moved forwards or backwards to a next position to readily carry another glass substrate 20. Thus by moving back and forth a number of times the glass substrate 20 can be loaded into the bracket 30.

In the event that unloading the glass substrate 20 is desired, the glass substrate 20 to be unloaded is lifted via the brace rack 61 and guided by the guiding mechanism 50 to be held upright above the bracket 30, and then the glass substrate 20 is gripped and removed by the robotic arm 10.

As a conclusion, the invention, through guiding of the guiding mechanism 50 and holding and lifting of the glass lifting mechanism 60, the glass substrate 20 can be loaded into the bracket 30 without the robotic arm 10 entering the bracket 30. Hence there is no need to spare extra space in the bracket 30 to receive the robotic arm 10. The interior space of the bracket 30 can be fully utilized to load more glass substrates 20. Thus the cost can be reduced and productivity can be improved to better meet production requirements.

What is claimed is:

1. An ancillary apparatus for receiving glass substrates from a robotic arm and loading the glass substrates into a bracket in sequence along a placing direction to make the glass substrates be erected on the bracket along an aligning direction perpendicular to the placing direction, comprising:
a holding rack to hold the bracket;
a guiding mechanism which is located above the bracket and includes two guiding portions corresponding to two sides of the bracket to hold the glass substrates gripped by the robotic arm and guide the glass substrates into the bracket along the placing direction; and
a glass lifting mechanism which is located below the bracket and includes a brace rack running through the bracket to brace the glass substrates, the brace rack being movable upwards and downwards along the placing direction and forwards and backwards along the aligning direction.

2. The ancillary apparatus of claim 1, wherein the holding rack holds two sets of the bracket and is mounted onto a rotary station.

3. The ancillary apparatus of claim 1, wherein the bracket is formed in a rectangular shape with four corners, the holding rack including four positioning elements butting the four corners to confine and hold the bracket.

4. The ancillary apparatus of claim 3 further including four movement adjustment decks adjacent to the four positioning elements to hold the bracket.

5. The ancillary apparatus of claim 1, wherein each of the two guiding portions includes at least one ancillary roller which includes a plurality of notches corresponding to the glass substrate.

6. The ancillary apparatus of claim 5, wherein the ancillary roller is located on a transverse moving member.

7. The ancillary apparatus of claim 1, wherein the glass lifting mechanism includes a moving deck, a moving motor, a lifting motor, at least one upright post, a screw bar and a straight gear rack; the moving deck being slidably located on the holding rack, the moving motor and the lifting motor being fixedly located on the moving deck, the moving motor engaging with the straight gear rack via a gear, the straight gear rack being fixedly located on the holding rack, the upright post and the screw bar being mounted upright onto the moving deck, the upright post running through the brace rack, the screw bar screwing through the brace rack, and the lifting motor engaging with the screw bar via a belt.

8. The ancillary apparatus of claim 7, wherein the holding rack includes at least one guide rod parallel with the straight gear rack, the moving deck straddling the guide rod.

9. A method for loading glass substrates gripped by a robotic arm into a bracket in sequence along a placing direction to make the glass substrates be erected on the bracket along an aligning direction perpendicular to the placing direction, comprising the steps of:
positioning the bracket onto a holding rack and positioning a guiding mechanism above the bracket and positioning a glass lifting mechanism below the bracket, the glass lifting mechanism being movable upwards and downwards along the placing direction and forwards and backwards along the aligning direction;
gripping the glass substrates via the robotic arm and moving the glass substrates above the bracket; and
releasing the glass substrates from the robotic arm and guiding the glass substrates via the guiding mechanism and holding the glass substrates via the glass lifting mechanism to enter the bracket along the placing direction, the glass lifting mechanism moving upwards and downwards and forwards and backwards to erect the glass substrates on the bracket along the aligning direction.

10. The method of claim 9, wherein the guiding mechanism includes two guiding portions corresponding to two sides of the bracket to hold the glass substrate gripped by the robotic arm and guide the glass substrate into the bracket.

11. The method of claim 10, wherein each of the two guiding portions includes at least one ancillary roller which includes a plurality of notches corresponding to the glass substrate.

12. The method of claim 11, wherein the ancillary roller is located on a transverse moving member.

13. The method of claim 9, wherein the glass lifting mechanism includes a brace rack running through the bracket to brace the glass substrate, the brace rack being movable upwards and downwards and forwards and backwards.

14. The method of claim 13, wherein the glass lifting mechanism further includes a moving deck, a moving motor, a lifting motor, at least one upright post, a screw bar and a straight gear rack; the moving deck being slidably located on the holding rack, the moving motor and the lifting motor being fixedly located on the moving deck, the moving motor engaging with the straight gear rack via a gear, the straight gear rack being fixedly located on the holding rack, the upright post and the screw bar being mounted upright onto the moving deck, the upright post running through the brace rack, the screw bar screwing through the brace rack, and the lifting motor engaging with the screw bar via a belt.

15. The method of claim 14, wherein the holding rack includes at least one guide rod parallel with the straight gear rack, the moving deck straddling the guide rod.

16. The method of claim 9, wherein the holding rack holds two sets of the bracket and is mounted onto a rotary station.

17. The method of claim 9, wherein the bracket is formed in a rectangular shape with four corners, the holding rack including four positioning elements butting the four corners to confine and hold the bracket.

18. The method of claim 17 further including four movement adjustment decks adjacent to the four positioning elements to hold the bracket.

\* \* \* \* \*